June 6, 1967 G. D. ROSE ET AL 3,323,957

PRODUCTION OF SEMICONDUCTOR DEVICES

Filed Nov. 5, 1964

WITNESSES

*Edwin E. Bassler*

*James F. Young*

INVENTORS

Gerald D. Rose &

Paul F. Schmidt

BY *C. L. Menzemer*

ATTORNEY 3,323,957
PRODUCTION OF SEMICONDUCTOR DEVICES

Gerald D. Rose, Indianapolis, Ind., and Paul F. Schmidt, Pittsburgh, Pa., assignors to Westinghouse Electric Corporation, East Pittsburgh, Pa., a corporation of Pennsylvania Filed Nov. 5, 1964, Ser. No. 409,241
8 Claims. (Cl. 148—177)

Figure 1:
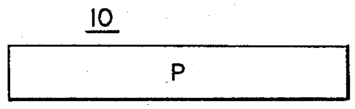

The present invention relates to the production of semiconductor devices, and more particularly to the preparation of semiconductor wafers therefor.

Heretofore, in the fabrication of semiconductor devices, problems have arisen in alloying large area metal contacts to the semiconductor wafer. This problem has been attributed to non-uniform penetration of the recrystallization front, meaning that on certain segments of the semiconductor wafer surface, local retardation of the recrystallization front occurs and on other segments local deeper penetration occurs. One of the primary reasons for non-uniform penetration of the recrystallization front is poor wetting of the semiconductor wafer surface by the metal contact. This is believed to be related to the surace condition of the wafer just prior to alloying of the metal contacts.

It is known that alloying metal contacts to somewhat rough surfaces on semiconductor wafers results in better contacts than alloying to perfectly smooth surfaces. The roughness, of course, increases the effective surface area. Furthermore, it is believed that cracking of a very thin oxide film of about 50–100A thickness at the temperature of alloying is much more pronounced and uniform on a rough surface. Owing to this phenomenon, prior workers have attempted to fabricate devices by first lapping the semiconductor wafers with an abrasive and then incompletely etching the wafer with etchings such as a mixture of nitric and hydrofluoric acids or potassium hydroxide so that a small degree of roughness was intentionally left on the surface thereof. This technique, however, also left some uncontrolled damage on the surface of the wafer.

Also, it has been found that doping of the semiconductor wafer by diffusion or other means into this incompletely etched surface cannot be as perfectly controlled as doping into a smooth surface. This is due to the fact that a rough surface will absorb more impurities than a smooth surface. The doping operation cannot be carried out prior to the lapping and etching since the distance of dopant penetration must be rigidly controlled and the subsequent polishing and etching treatment would cause uncontrollable variations in penetration.

Further, the roughness left on the surface after etching by the above method is not completely uniform on a microscopic scale with the result that undulations of the surface are easily observed under an interference microscope. In addition, any microcracks that occur during lapping tend to propagate into the crystal as grooves during chemical etching.

Accordingly, it is an object of the present invention to overcome the shortcomings heretofore encountered in the preparation of semiconductor devices having large area alloyed contacts.

A further object of the invention is to provide a novel method for improving the quality of alloyed contacts to semiconductor wafers.

Another object of the invention is to provide semiconductor devices having alloyed metallic contacts characterized by uniform recrystallization fronts.

Figure 6:
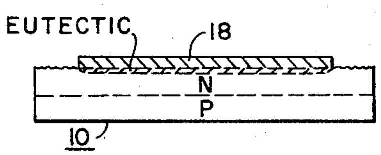
Figure 7:
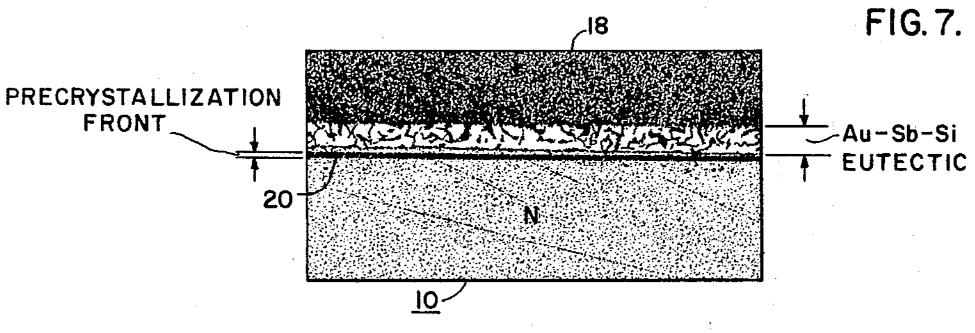

The above and other objects and features of the invention will become apparent from the following detailed description taken in connection with the accompanying drawings, in which:

FIGS. 1 through 6 are cross-sectional views depicting the processing of a semiconductor wafer in accordance with one method of the present invention; and FIG. 7 is a presentation of a photomicrograph at 200× magnification of a section of a semiconductor wafer processed in accordance with the present invention.

The present invention is predicated upon the discovery that a silicon surface immediately beneath a porous oxide layer produced by electrochemical methods becomes pitted on a microscopic or submicroscopic scale, and that this oxide film can easily be removed in reactive acids without attacking the silicon surface itself. However, while particularly adapted for use with silicon, the invention also has utility with other semiconductor or refractory metals from which an oxide film can be removed without affecting the substrate.

Briefly, according to one embodiment of the invention, a surface of a semiconductor wafer is prepared preferably by electropolishing or etching, for doping, by diffusion. The wafer is doped with an impurity to form within the wafer one or more P–N junctions or portions thereof. A relatively thin, porous oxide coating is then formed on a prepared surface of the wafer to cause substantially uniform pitting of that surface. Thereafter, the oxide coating is removed to expose the pitted surface. Finally, a metallic contact member which can be of relatively large surface area is disposed on the pitted surface in a sandwich-like fashion and the sandwich subjected to a temperature sufficient to cause alloying between a portion of the semiconductor wafer and the contact member whereby a substantially uniform region of recrystallization is maintained between the alloyed portion and the wafer proper.

Figure 2:
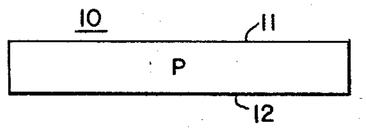

Referring to FIGS. 1 through 6, a semiconductor device may be fabricated from a single P-type crystal silicon wafer 10, as shown in FIG. 1, with dimensions of approximately 0.2 inch square and 0.01 inch thick. The wafer 10 may be produced in a variety of ways well known in the art and is suitably prepared by electropolishing or chemical etching. FIG. 2 represents the wafer 10 after this treatment indicating the smooth surfaces 11 and 12 obtained on the wafer of FIG. 1. The drawing indicates that the wafer 10 is of P-type silicon; however, the present invention may be practiced on any semiconductor member on which anodic oxide films can be formed including the III–V compounds, SiC and a variety of others.

Figure 3:
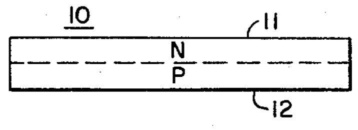

As shown in FIG. 3, the wafer is doped with an N-type impurity, for instance, by vapor diffusion to produce a P-N junction within the wafer. Elements of Group V of the periodic system are generally used as N-type dopants in silicon, especially, P, Sb and As. Other dopants, of course, can be employed with different semiconductor materials. In order to restrict the process of doping to the formation of one junction as shown in FIG. 3, a mask may be applied to all surfaces of the wafer except the surface being subjected to the dopant, which is surface 11 in this case. Thus, the silicon wafer 10 now comprises an upper portion of N-type conductivity and a lower portion of P-type conductivity.

Figure 4:
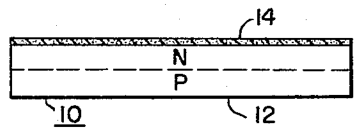
Figure 5:
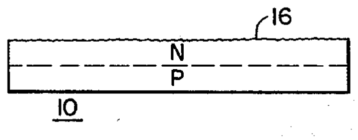

The upper major surface 11 of the wafer is then subjected to anodic oxidation to produce a relatively thin, porous layer 14 of silicon dioxide thereon as shown in FIG. 4. It should be appreciated that the top and bottom faces of the wafer may be oxidized in this manner simultaneously by masking the sides of the wafer or the entire wafer may be oxidized.

Anodic oxidation is a treatment well known in the art, particularly with respect to alumium. In general, the semiconductor wafer is made the anode in a suitable electrolyte; an inert material is used as the cathode; and a potential is applied between the wafer and cathode.

The formation of a porous oxide film requires the use of an electrolyte with the proper ratio of a good oxide forming solution to the amount of a dissolving agent for the oxide of the material undergoing anodization. The number and diameter of the pores depend upon the electrolyte composition, the current density, and the temperature of the anodizing bath which is important when attempting to optimize the alloying properties of a semiconductor wafer prepared in this manner. The pores penetrate close to, but not all the way down to, the metal-oxide interface. A very thin non-porous oxide film is located at the wafer-oxide interface, its thickness depending upon the formation voltage. The pores are generally straight, uniform in diameter, and of substantially equal depth.

Beneath each pore there is a shallow pit in the wafer indicating that continuous dissolution and regrowth of oxide occurred in each pore. The diameter of each depression in the oxide is about three times the depth of the pit and the pits are substantially uniform.

Concerning the formation potential or voltage applied in anodic oxidation, if for a given forming electrolyte, the formation voltage is raised too high, then local avalanches occur in the oxide. These avalanches cause strong heating of the oxide, which results in enhanced local reaction rates, and consequently, in non-uniform and deep pitting. Accordingly, this critical voltage must be determined experimentally with a given electrolyte. It is believed that in most cases the forming voltage should not exceed about 400 volts.

It should be noted that when starting with an N-type silicon wafer, it is also necessary to illuminate the crystal during anodization in order to inject the minority carriers required by the electrochemical reaction. Otherwise, the reversely biased surface barrier on N-type silicon would undergo local breakdown and non-uniform pitting would result.

The wafer is next subjected to the action of an etch solution on its upper face to remove the oxide layer 14. The result of this treatment is the structure shown in FIG. 5 in which the pits 16 on the surface of the silicon substrate are exposed. The most suitable etchants for accomplishing this treatment are hydrogen fluoride and ammonium bifluoride.

Referring to FIG. 6, a metallic contact member 18, such as, for example, gold-antimony or aluminum is disposed on the pitted surface of the wafer and both the wafer and contact member are subjected to a temperature sufficient to cause alloying between the N-type portion of the semiconductor wafer 10 and the contact member 18 (generally the eutectic temperature of the metallic contact material and semiconductor material). The alloying step may be carried out in any suitable heating chamber free of impurities and dust, having a non-oxidizing atmosphere.

The following examples are illustrative of the teachings of the invention.

*Example I*

A silicon wafer, 0.20 inch square by 0.01 inch was etched in a solution consisting of one part hydrofluoric acid and nine parts nitric acid. The silicon used was P-type, single crystalline, <111> oriented, and had a resistivity of about 3.5 ohm/cm.

The wafer was properly masked, placed in a tube type diffusion furnace and heated at about 1200° C. in a vapor of phosphorus pentoxide for about one and one-half hours which resulted in the formation of an N-type layer having a thickness of about 0.005 inch from the bottom face. The doped silicon wafer was immersed in the following electrolyte: 2 grams of ammonium nitrate, 5 ml. of dilute aqueous hydrofluoric acid made by adding 1 ml. of 48% HF to 250 ml. of water, 92 ml. of tetrahydrofurfuryl alcohol and 3 ml. of nitropropane.

The wafer was anodized in the above solution at a current density of about 20 ma./cm.$^2$ for about seven minutes until the forming voltage had risen to above 300 but less than 400 volts, preferably about 350 volts. By forming voltage is meant the voltage measured between an ohmic contact to the silicon and a non-current carrying electrode in the solution. The temperature of the bath during anodization was less than 40° C. and preferably room temperature.

The oxidized silicon wafer surface was then etched in hydrofluoric acid to remove the oxide coating and expose the pitted surface formed from the anodization process. The wafer was dried and a gold-antimony contact member, having a thickness of about 0.001 inch, was disposed on the pitted surface. The contact-wafer sandwich was placed in a furnace and heated to a temperature of 700° C. for a period of 5 minutes. The wafer was removed from the furnace, cooled and sectioned for examination. FIG. 7 shows the high quality of the gold-antimony alloyed contact to the pitted silicon surface. Note the completely uniform recrystallization front 20 of the Au-Sb-Si eutecic, which is critical, especially in 4-layer type devices.

*Example II*

A silicon wafer of similar dimensions and properties was etched in the same solution as Example I.

After doping as above, the wafer was first immersed in a solution consisting of 2 grams sodium nitrite and 100 ml. of tetrahydrofurfuryl alcohol at a current density of about 4 ma./cm.$^2$ for about four minutes until the forming voltage had risen to about 150 volts. The wafer was removed from this solution and at this point contained a relatively thick non-porous oxide coating. The oxide coated surface was then immersed in a solution consisting of 2 parts dimethylsulfoxide, 2 parts water and 1 part formic acid. The anodization was carried out at a current density of about 20 ma./cm.$^2$ and a forming voltage of 300 volts for about six minutes to provide porosity in the oxide coating and consequent pitting on the surface of the wafer.

The porous oxide coating was then removed in hydrofluoric acid to expose the pitted surface. A gold-antimony contact was alloyed to the pitted surface as in Example I. The resulting wafer was then sectioned and examined. The results were similar to Example I

*Example III*

A silicon wafer was processed exactly as in Example I with the exception that an aluminum contact was alloyed to the pitted surface. The results were similarly good.

Although the invention has been described in connection with certain specific embodiments, it will be readily apparent to those skilled in the art that various changes may be made to suit requirements without departing from the spirit and scope of the invention.

We claim as our invention:

1. In the method for producing semiconductor devices, the steps comprising:

forming a relatively thin, porous oxide coating on one surface of a semiconductor wafer, the surface being substantially uniformly pitted therefrom, removing the oxide coating, thereby exposing said pitted surface, and disposing a metallic contact member on the pitted surface and subjecting the wafer and contact member to a temperature sufficient to cause alloying between a portion of the semiconductor wafer and the contact member whereby a substantially uniform region of recrystallization is maintained between the alloyed portion and the wafer portion.

2. In the method for producing semiconductor devices, the steps comprising:

preparing at least one surface of a semiconductor wafer for doping, doping said wafer with an impurity to form within said wafer at least one P–N junction portion, forming a relatively thin, porous oxide coating on said surface of the wafer, the surface being substantially uniformly pitted therefrom, removing the oxide coating, thereby exposing said pitted surface, and disposing a metallic contact member on the pitted surface and subjecting the wafer and contact member to a temperature sufficient to cause alloying between a portion of the semiconductor wafer and the contact member whereby a substantially uniform region of recrystallization is maintained between the alloyed portion and the wafer proper.

3. The method of claim 2 in which doping of a semiconductor surface is accomplished by diffusion.

4. The method of claim 2 in which the porous layer is provided by anodic oxidation.

5. The method according to claim 4 in which the anodic oxidation is carried out in an electrolyte consisting of a mixture of ammonium nitrate, dilute hydrofluoric acid, tetrahydrofurfuryl alcohol and nitropropane.

6. In the method for producing semiconductor devices, the steps comprising:

polishing and etching at least one surface of a semiconductor wafer, diffusing into said wafer an impurity to form within the wafer at least one P–N junction portion, forming a relatively thick non-porous oxide coating on said surface of the wafer by anodic oxidation in a first electrolyte, subjecting the oxide coating to a second electrolyte capable of reacting with said coating to provide a plurality of pores therein and a plurality of substantially uniform pits, in the surface of the wafer, removing said oxide coating, thereby exposing said pitted surface, and disposing a metallic contact member on the pitted surface and subjecting the wafer and contact member to a temperature sufficient to cause alloying between a portion of the semiconductor wafer and the contact member whereby a substantially uniform region of recrystallization is maintained between the alloyed portion and the wafer proper.

7. The method of claim 6 in which said first electrolyte is a solution consisting of sodium nitrate in tetrahydrofurfuryl alcohol and said second electrolyte is a solution consisting of dimethylsulfoxide, formic acid and water.

8. In the method for producing semiconductor devices containing a semiconductor wafer having at least one P–N junction portion, the improvement comprising forming a relatively thin, porous oxide coating on at least one surface of the semiconductor wafer by anodic oxidation, the surface being substantially uniformly pitted therefrom, removing the oxide coating, thereby exposing said pitted surface, and disposing a metallic contact member on the pitted surface and subjecting the wafer and contact member to a temperature sufficient to cause alloying between a portion of the semiconductor wafer and the contact member whereby a substantially uniform region of recrystallization is maintained between the alloyed portion and the wafer proper.

References Cited

UNITED STATES PATENTS

| | | | |
|---|---|---|---|
| 3,009,841 | 11/1961 | Faust | 148—177 |
| 3,158,505 | 11/1964 | Sandor | 148—179 |
| 3,160,534 | 12/1964 | Oroshnik | 148—179 |
| 3,232,800 | 2/1966 | Mihara et al. | 148—179 |

DAVID L. RECK, *Primary Examiner.*

R. O. DEAN, *Assistant Examiner.*